(12) United States Patent
Hwang et al.

(10) Patent No.: US 7,744,341 B2
(45) Date of Patent: Jun. 29, 2010

(54) THERMAL MODULE WITH CENTRIFUGAL BLOWER AND ELECTRONIC ASSEMBLY INCORPORATING THE SAME

(75) Inventors: Ching-Bai Hwang, Tu-Cheng (TW); Ran Lin, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 812 days.

(21) Appl. No.: 11/615,912

(22) Filed: Dec. 22, 2006

(65) Prior Publication Data

US 2008/0149306 A1 Jun. 26, 2008

(51) Int. Cl.
*F01D 3/02* (2006.01)
(52) U.S. Cl. ...................................... 415/102; 415/206
(58) Field of Classification Search .................. 415/93, 415/94, 95, 97, 98, 101, 102, 103, 224, 182.1
See application file for complete search history.

(56) References Cited

U.S. PATENT DOCUMENTS 5,813,834 A * 9/1998 Hopfensperger et al. .... 415/206
6,472,781 B2 * 10/2002 Yamamoto .................. 415/177
6,654,245 B2    11/2003 Kawashima et al.
6,781,835 B2 *  8/2004 Hashimoto et al. .......... 415/206

FOREIGN PATENT DOCUMENTS

JP         2001-57493 A       2/2001

* cited by examiner

*Primary Examiner*—Richard Edgar
(74) *Attorney, Agent, or Firm*—Jeffrey T. Knapp

(57) ABSTRACT

An electronic assembly (1) includes a top cover (21), a bottom cover (22) and a thermal module (10). The thermal module includes a centrifugal blower (14) and a fin assembly (12). The blower includes a top lid (142) defining a first air inlet (146) therein, a bottom plate (147) defining a second air inlet (150) therein, and a sidewall (148). An air outlet (149) is defined in the blower in front of the sidewall. A first distance (H1) formed between the top cover and the top lid is greater than a second distance (H2) formed between the bottom cover and the bottom plate. A left edge (154) of the second air inlet adjacent to the air outlet offsets a distance from a corresponding left edge (155) of the first air inlet inwardly toward a rotation axis (A) of an impeller (143) of the blower.

9 Claims, 6 Drawing Sheets

THERMAL MODULE WITH CENTRIFUGAL BLOWER AND ELECTRONIC ASSEMBLY INCORPORATING THE SAME

BACKGROUND OF THE INVENTION

1. Field of the Invention

The present invention relates generally to a centrifugal blower, and more particularly to a thermal module using the centrifugal blower and an electronic assembly incorporating the thermal module.

2. Description of Related Art

It is well known that heat is produced by electronic components such as integrated circuit chips during normal operation. If this heat is not quickly removed, these electronic components may overheat. Therefore, thermal modules are often used to cool these electronic components.

As an example, a thermal module in accordance with related art generally includes a fin assembly having a plurality of fins, a centrifugal blower for creating an airflow through the fin assembly, and a heat pipe having an evaporating section which is kept in thermal contact with a heat generating electronic component such as a central processing unit (CPU) of a laptop computer, and a condensing section to which the fin assembly is attached. The heat pipe transfers heat from the heat generating electronic component to the fin assembly. The heat is then dissipated into ambient atmosphere via the airflow flowing through the fin assembly.

Increasing the amount of the airflow provided by the centrifugal blower is an effective way to improve the heat dissipation efficiency of the thermal module. Conventional ways of satisfying such requirement are to change the configurations of blades of the blower, the configuration of the casing of the blower, and the parameters of the motor of the blower. However, such changes complicate the design and the manufacture of the centrifugal blower and further increase the cost thereof. Therefore, a centrifugal blower capable of providing a large amount of airflow and having a simple structure and a low manufacturing cost is needed.

SUMMARY OF THE INVENTION

The present invention relates, in one respect, to a centrifugal blower capable of providing a high volume of airflow, in another respect, to a thermal module using the centrifugal blower, and in a third respect, to an electronic assembly incorporating the thermal module. The centrifugal blower has a low manufacturing cost and a simple structure. According to a preferred embodiment of the present invention, the electronic assembly includes an enclosure including a top cover and a bottom cover, and a thermal module arranged between the top cover and the bottom cover of the enclosure. The thermal module includes a centrifugal blower and a fin assembly. The centrifugal blower includes a top lid defining a first air inlet therein, a bottom plate defining a second air inlet therein, a sidewall disposed between the top lid and the bottom plate and defining an air outlet therein. A first distance formed between the top cover of the enclosure and the top lid of the centrifugal blower is greater than a second distance formed between the bottom cover of the enclosure and the bottom plate of the centrifugal blower. An edge of the bottom plate defining the second air inlet and located adjacent to the air outlet offsets inwardly a distance from a corresponding edge of the top lip along a direction from the air outlet towards an impeller of the centrifugal blower so that the edge of the bottom plate is not aligned with the corresponding edge of the top lid and is located nearer to a rotation axis of the impeller than the corresponding edge of the top lid.

Other advantages and novel features of the present invention will become more apparent from the following detailed description of preferred embodiment when taken in conjunction with the accompanying drawings, in which:

DETAILED DESCRIPTION OF THE INVENTION

Figure 6:
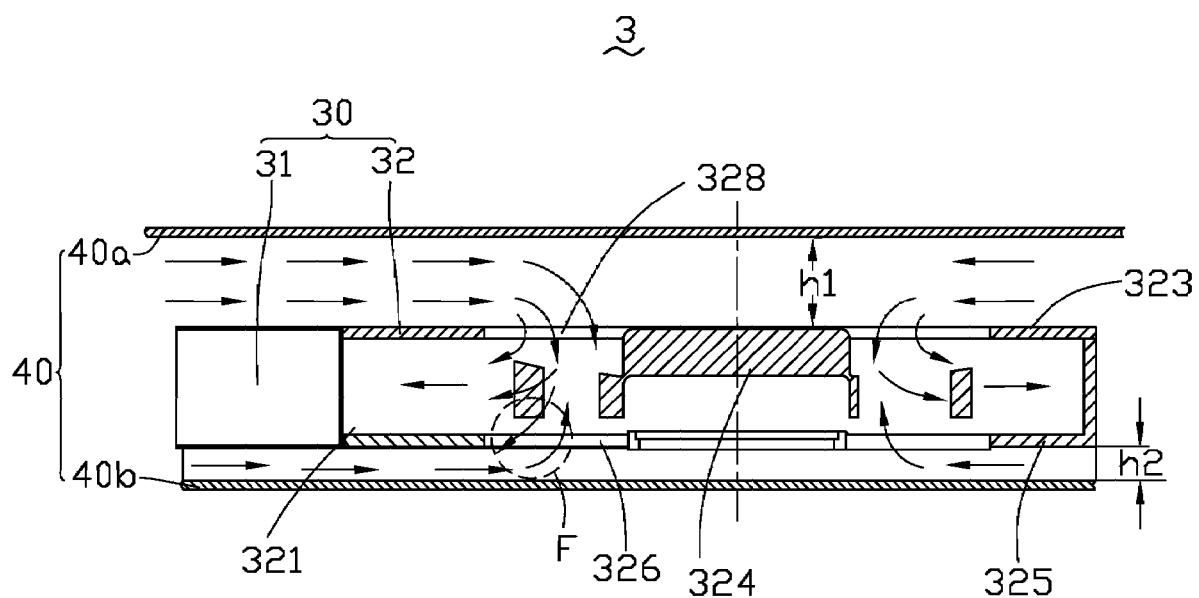
FIG. 6 is cross-sectional view of an electronic assembly in accordance with related art containing a thermal module and an enclosure of an electronic product.

Referring to FIG. 6, an electronic assembly 3 in accordance with related art is shown. The electronic assembly 3 includes a thermal module 30 and an enclosure 40 of an electronic product (not shown) such as a laptop computer, a desktop computer, or a DVD player. In this embodiment, the electronic product is a laptop computer. The enclosure 40 includes a top cover 40a and a bottom cover 40b. The thermal module 30 is mounted between the top cover 40a and the bottom cover 40b, and includes a centrifugal blower 32 and a fin assembly 31. The fin assembly 31 is arranged in an air outlet 321 of the centrifugal blower 32 and thermally connects with a heat-generating electronic component (not shown) of the electronic product to absorb heat therefrom. The centrifugal blower 32 includes a bottom housing 325 and a top lid 323 covering the bottom housing 325. An impeller 324 is rotatably disposed in an inner space formed between the top lid 323 and the bottom housing 325, for driving airflow flowing through the fin assembly 31 to take away heat therefrom. The top lid 323 and the bottom housing 325 of the centrifugal blower 32 respectively define a first air inlet 328 and a second air inlet 326 therein. The first and second air inlets 328, 326 are round-shaped in profile and are concentric with each other. A diameter of the first air inlet 328 is equal to a diameter of the second air inlet 326. The air enters into the centrifugal blower 32 via the first and second air inlets 328, 326.

When the thermal module 30 is assembled in the enclosure 40 of the electronic product, there are tiny distances formed between the top cover 40a and the bottom cover 40b of the enclosure 40 and the respective top lid 323 and bottom housing 325 of the centrifugal blower 32 of the thermal module 30, i.e., a first distance h1 formed between a bottom surface of the top cover 40a of the enclosure 40 and a top surface of the top lid 323 of the centrifugal blower 32, and a second distance h2 formed between a top surface of the bottom cover 40b of the enclosure 40 and a bottom surface of the bottom housing 325 of the centrifugal blower 32. In the electronic product, the thermal module 30 is usually arranged in a position which makes the first distance h1 greater than the second distance h2. When the flow field of the airflow was simulated by using computational fluid dynamics (CFD) software, it was found that the amount of the air entering into the centrifugal blower 32 via the first air inlet 328 is more than that of the air entering into the centrifugal blower 32 via the second air inlet 326. When a part of the airflow flows towards the fin assembly 31 via the air outlet 321, the other part of the airflow surrounded by circle F moves downwardly towards the bottom housing 325 of the centrifugal blower 32 and leaks from the centrifugal blower 32 via the second air inlet 326 at the side adjacent to the air outlet 321. The airflow flowing towards the fin assembly 31 from the centrifugal blower 32 is therefore decreased, which further decreases the heat dissipation efficiency of the thermal module 30. Meanwhile, the other part of the airflow collides with the airflow entering into the centrifugal blower 32 via the second air inlet 326, which decreases the airflow entering into the centrifugal blower 32 and further decreases the heat dissipation efficiency of the thermal module 30. In addition, the collision between the inlet airflow and the outlet airflow at the second air inlet 326 increases noisy generated by the centrifugal blower 32, which sometimes may adversely affect the acceptance of the electronic product, i.e., the lap computer. Therefore, applicant contrives to solve such problems of the related art.

Figure 1:
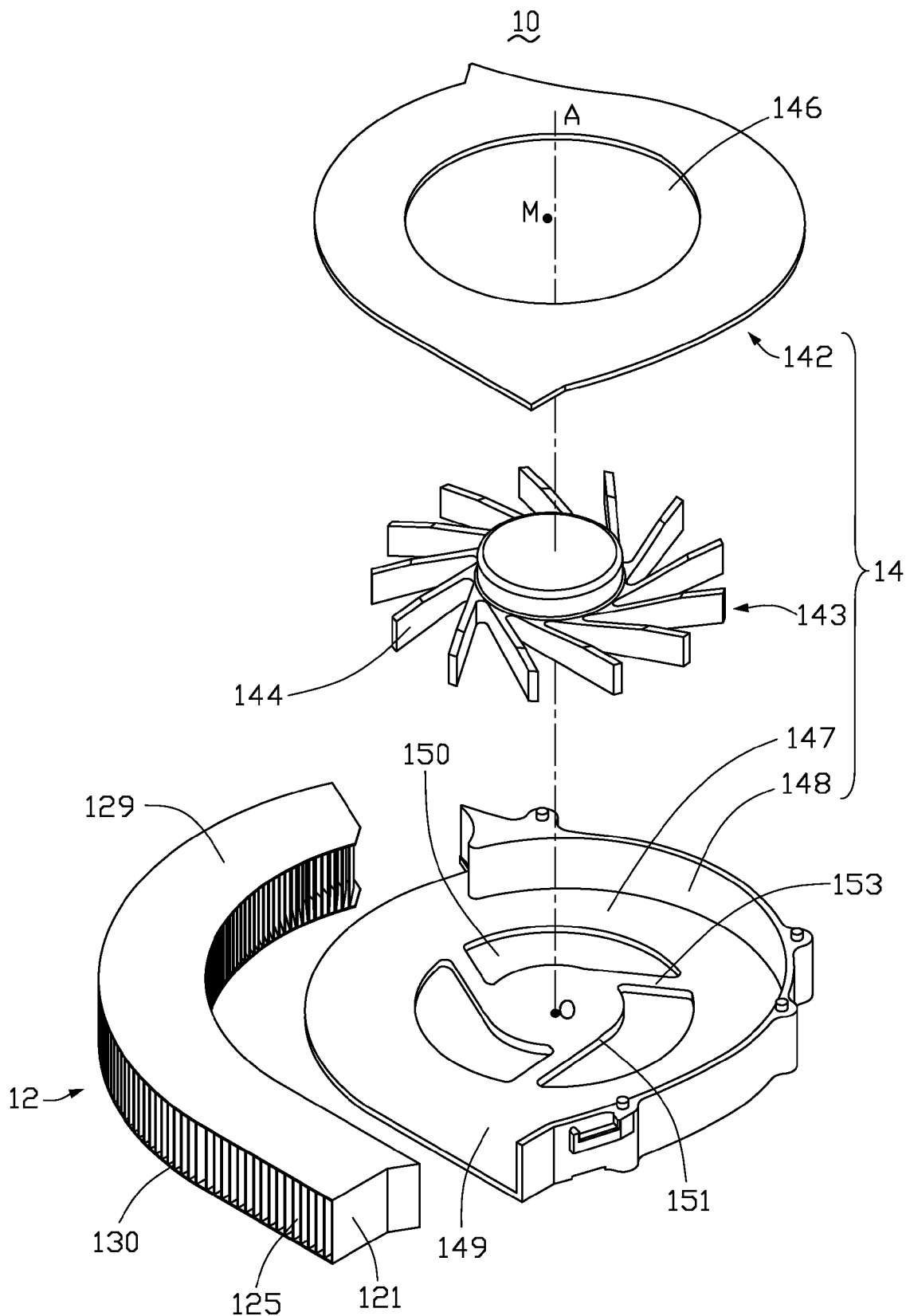
FIG. 1 is an exploded, isometric view of a thermal module according to a preferred embodiment of the present invention.
Figure 2:
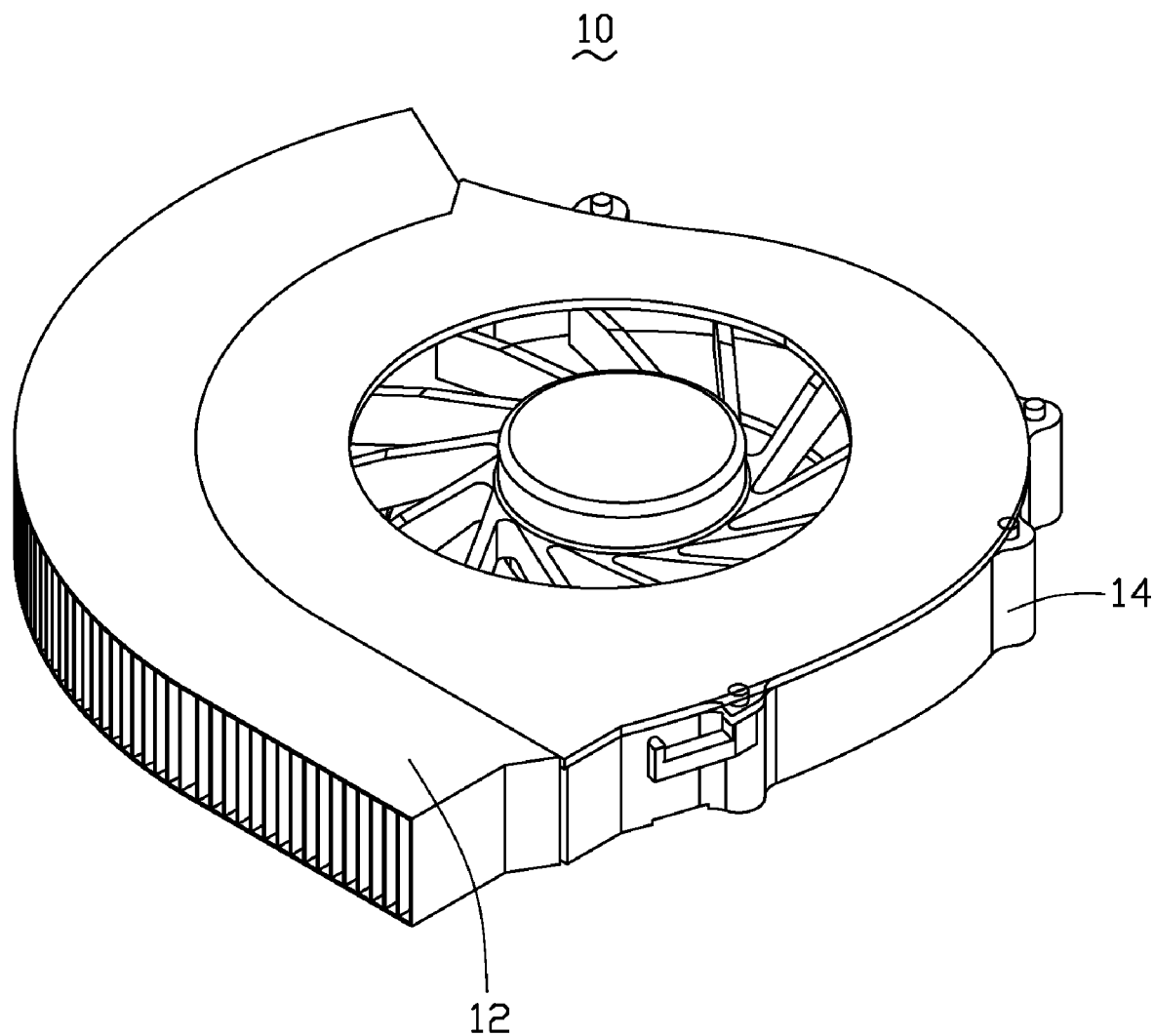
FIG. 2 is an assembled view of the thermal module of FIG. 1.

Referring to FIGS. 1 and 2, a thermal module 10 according to a preferred embodiment of the present invention is shown. The thermal module 10 is mounted in an enclosure 20 (shown in FIG. 4) of an electronic product (not shown) such as a laptop computer, a desktop computer, or a DVD player so as to build an electronic assembly 1 (shown in FIG. 4). The thermal module 10 includes a centrifugal blower 14 and a fin assembly 12. The fin assembly 12 thermally connects with a heat-generating electronic component (not shown) of the electronic product via a heat transfer element (not shown) such as a heat pipe so as to absorb heat therefrom. The centrifugal blower 14 provides an airflow flowing through the fin assembly 12 so as to take away heat therefrom.

The centrifugal blower 14 includes a top lid 142, a bottom plate 147, a sidewall 148 perpendicularly and upwardly extending from a periphery of the bottom plate 147. An impeller 143 including a plurality of blades 144 is disposed in an inner space formed between the top lid 142, the bottom plate 147 and the sidewall 148. The top lid 142 and the bottom plate 147 are planar plates, which are perpendicular to a rotation axis A of the impeller 143. The sidewall 148 is arc-shaped in profile. An arc-shaped air outlet 149 is defined by the centrifugal blower 14 in front of the sidewall 148. The fin assembly 12 is arranged at the air outlet 149 of the centrifugal blower 14 and is arc-shaped in profile so as to match the air outlet 149. The fin assembly includes a plurality of fins 121. A plurality of air passages 125 are formed between two adjacent fins 121 for passages of the airflow. The fin assembly 12 has a top surface 129 and an opposite bottom surface 130. The top surface 129 of the fin assembly 12 is coplanar with a top surface of the top lid 142 of the centrifugal blower 14, whilst the bottom surface 130 of the fin assembly 12 is coplanar with a bottom surface of the bottom plate 147 of the centrifugal blower 14.

The top lid 142 and the bottom plate 147 respectively define a first air inlet 146 and a second air inlet 150 therein. The air enters into the centrifugal blower 14 via the first and second air inlets 146, 150. The first and second air inlets 146, 150 both are round-shaped in profile. A diameter of the second air inlet 150 is smaller than a diameter of the first air inlet 146. The bottom plate 147 includes a rounded supporting portion 151 disposed in the second air inlet 150 of the centrifugal blower 14 for supporting the impeller 143. Three ribs 153 extend from a periphery of the supporting portion 151 towards the bottom plate 147 so as to connect the supporting portion 151 with the bottom plate 147.

Figure 3:
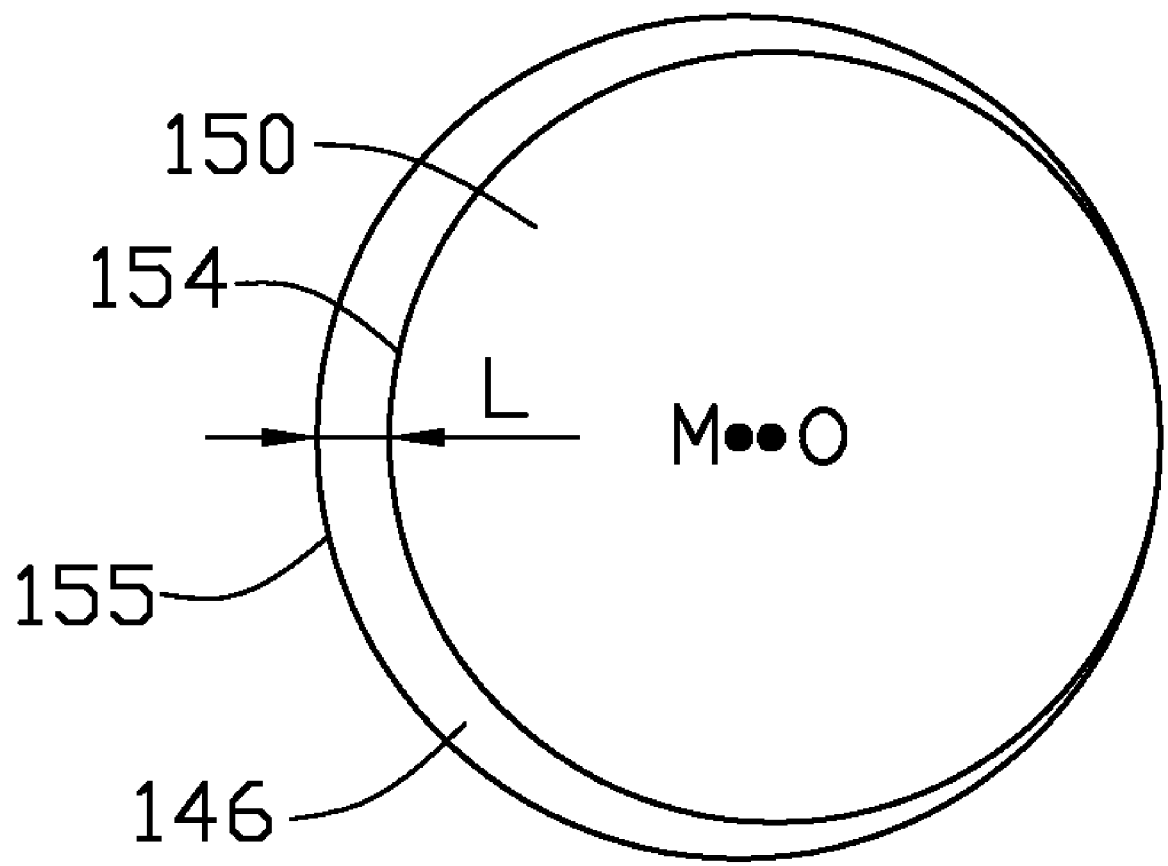
FIG. 3 is a diagrammatical view showing a positional relation between a first air inlet and a second air inlet of a centrifugal blower of the thermal module of FIG. 1.

The supporting portion 151 is concentric with the second air inlet 150 of the centrifugal blower 14, whilst the impeller 143 is concentric with the supporting portion 151 of the centrifugal blower 14. Therefore, the center O of the second air inlet 150 locates on the rotation axis A of the impeller 143. The center M of the first air inlet 146 offsets towards a left side of the rotation axis A of the impeller 143 so that the center M of the first air inlet 146 spaces a shorter distance from the air outlet 149 of the centrifugal blower 14 than the center O of the second air inlet 150. As viewed from FIG. 3, a left edge 154 of the bottom plate 147 of the centrifugal blower 14, which locates at a left side of the second air inlet 150 and adjacent to the air outlet 149, offsets a distance L from a left edge 155 of the first air inlet 146 towards the rotation axis A (i.e., the center O of the second air inlet 150) of the impeller 143. That is, the left edge 154 of the second air inlet 150 locates inwardly beyond the left edge 155 of the first air inlet 146 as viewed from a top of the centrifugal blower 14. Moreover, right edges (not labeled) of the first and second air inlets 146, 150 are coincident with each other. Therefore, the offset distance L of the left edge 154 of the bottom plate 147 from the left edge 155 of the first air inlet 146 along a line extending through the center O of the second air inlet 150 and the center M of the first air inlet 146 is equal to a difference of diameters between the first air inlet 146 and the second air inlet 150.

Figure 4:
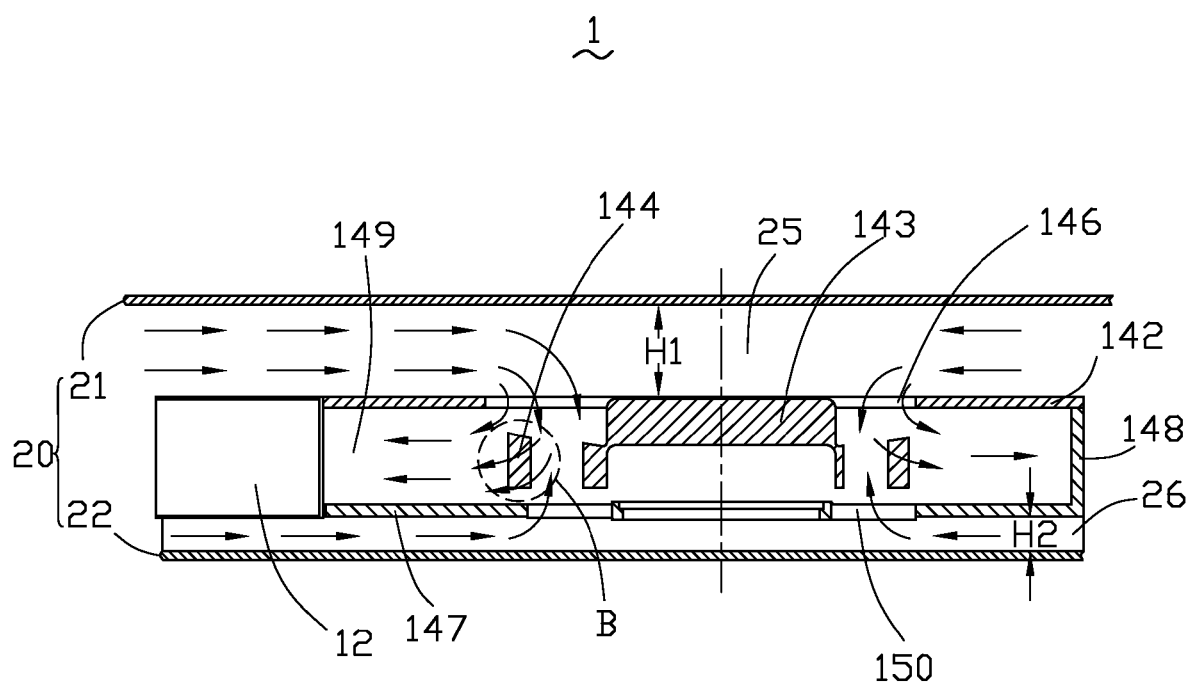
FIG. 4 is a cross-sectional view of an electronic assembly containing the thermal module of FIG. 2 and an enclosure of an electronic product.

Referring to FIG. 4, the enclosure 20 includes a top cover 21 and a bottom cover 22. The thermal module 10 is mounted between the top cover 21 and the bottom cover 22. The top lid 142 of the centrifugal blower 14 is arranged between the top cover 21 of the enclosure 20 and the bottom plate 147 of the centrifugal blower 14, whilst the bottom plate 147 of the centrifugal blower 14 is arranged between the top lid 142 of the centrifugal blower 14 and the bottom cover 22 of the enclosure 20. A first distance H1 formed between a bottom surface of the top cover 21 of the enclosure 20 and a top surface of the top lid 142 of the centrifugal blower 14 is greater than a second distance H2 formed between a top surface of the bottom cover 22 of the enclosure 20 and a bottom surface of the bottom plate 147 of the centrifugal blower 14. The amount of the air entering into the centrifugal blower 14 via the first air inlet 146 is more than that of the air entering into the centrifugal blower 14 via the second air inlet 150. A part of the air surrounded by circle B entering into the centrifugal blower 14 via the first air inlet 146 trends to flow downwardly towards the second air inlet 150. When the part of the air arrives at the second air inlet 150, it is blocked and is guided towards the air outlet 149 of the centrifugal blower 14 by the left edge 154 of the bottom plate 147 at the left side of the second air inlet 150. Therefore, the part of the air can not leak from the centrifugal blower 14 via the second air inlet 150, which increases the amount of the air generated by the centrifugal blower 14 and accordingly increases the amount of the air flowing towards the fin assembly 12. The heat dissipation efficiency of the thermal module 10 is therefore improved. The heat dissipation efficiency of the thermal module 10 is enhanced just by extending the left edge 154 of the bottom plate 147 at the left side of the second air inlet 150 inwardly beyond the left edge 155 of the first air inlet 146. Such a modification is quite simple, which simplifies the manufacture of the centrifugal blower 14 and therefore decreasing the cost of the centrifugal blower 14. Furthermore, the centrifugal blower 14 accordingly has a simple structure.

Figure 5:
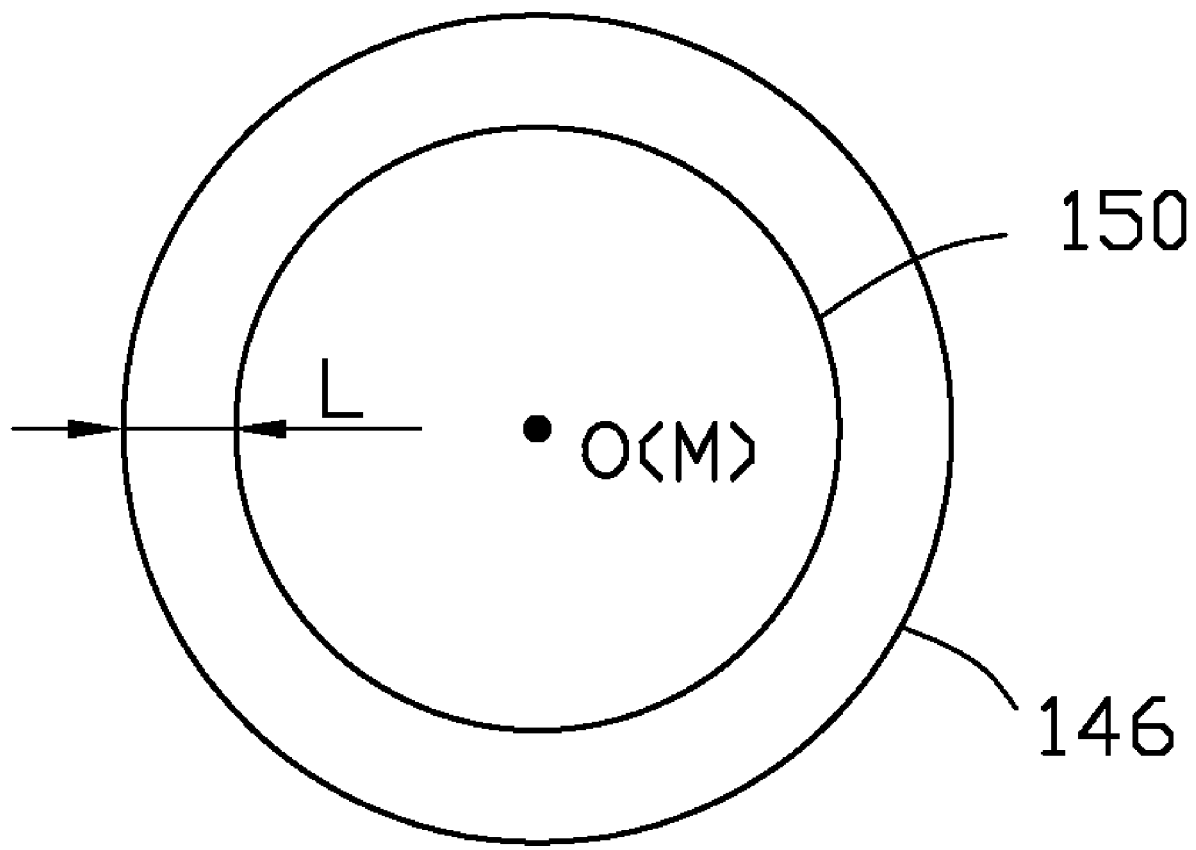
FIG. 5 is a diagrammatic view showing a relation between a first air inlet and a second air inlet of a centrifugal blower according to a second embodiment of the present invention.

In the thermal module 10, the center M of the first air inlet 146 offsets from the center O of the second air inlet 150. Alternatively, referring to the second embodiment of the present thermal module 10 shown in FIG. 5, the first air inlet 146 is concentric with the second air inlet 150. In addition, a diameter of the first air inlet 146 is greater than a diameter of the second air inlet 150. Therefore, a distance L between the left edge of the second air inlet 150 of the bottom plate 147 and the corresponding left edge of the first air inlet 146 of the top tip 142 is equal to ½ of a difference of diameters between the first air inlet 146 and the second air inlet 150.

In the above embodiments, the second air inlet 150 is disposed in a range circled by an edge of the first air inlet 146 as viewed from the top of the centrifugal blower 14. This decreases air turbulences between the airflow entering into the centrifugal blower 14 via the first air inlet 146 and the airflow entering into the centrifugal blower 14 via the second air inlet 150, and further increases the heat dissipation efficiency of the thermal module 10.

Table 1 below shows experimental data of the thermal module 10 of FIGS. 1 through 4, when the thermal module 10 is arranged in the enclosure 20 of the laptop computer. The rotation speed of the centrifugal blower 14 is 3600 rpm. The first distance H1 formed between the bottom surface of the top cover 21 of the enclosure 20 and the top surface of the top lid 142 of the centrifugal blower 14 is 3.6 mm. The second distance H2 formed between the top surface of the bottom cover 22 of the enclosure 20 and the bottom surface of the bottom plate 147 of the centrifugal blower 14 is 2.5 mm. As compared to the thermal module 30 shown in FIG. 6, the flow rate of airflow generated by the centrifugal blower 14 is 0.51 cfm (Cubic Feet Per Minute) more than that of the centrifugal blower 32 of the thermal module 30 of FIG. 6.

TABLE 1

|  | Q(cfm) | ΔQ(cfm) |
| --- | --- | --- |
| The thermal module of FIG. 6 | 3.91 | 0.51 |
| The present thermal module | 4.42 |  |

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A centrifugal blower comprising:
    a top lid defining a first air inlet therein;
    a bottom plate defining a second air inlet therein;
    a sidewall disposed between the top lid and the bottom plate;
    an air outlet defined between the top lid and the bottom plate and in front of the sidewall; and
    an impeller disposed in an inner space formed between the top lid, the bottom plate and the sidewall, for driving air entering the centrifugal blower via the first and second air inlets and leaving the centrifugal blower via the air outlet;
    wherein a diameter of the first air inlet is greater than that of the second air inlet, an edge of the bottom plate defining the second air inlet and located adjacent to the air outlet is located nearer to a rotation axis of the impeller than an edge of the top lid defining the first air inlet and located adjacent to the air outlet; and
    wherein the second air inlet has an edge which is located opposite to the air outlet and is coincident with an edge of the first air inlet opposite the air outlet.

2. The centrifugal blower as described in claim 1, wherein a center of the first air inlet offsets from a center of the second air inlet, the second air inlet being disposed within the first air inlet as viewed from a top of the centrifugal blower.

3. A thermal module comprising:
    a centrifugal blower comprising a top lid defining a first air inlet therein, a bottom plate defining a second air inlet therein, a sidewall disposed between the top lid and the bottom plate, an air outlet in front of the sidewall, and an impeller disposed in an inner space formed between the top lid, the bottom plate and the sidewall, wherein a diameter of the first air inlet is greater than that of the second air inlet, an edge of the bottom plate defining the second air inlet and located adjacent to the air outlet offsetting a distance from an edge of the top lid defining the first air inlet and located adjacent to the air outlet towards a rotation axis of the impeller; and
    a fin assembly arranged at the air outlet of the centrifugal blower;
    wherein a center of the first air inlet offsets from a center of the second air inlet, the second air inlet being disposed within the first air inlet as viewed from a top of the centrifugal blower.

4. The thermal module as described in claim 3, wherein the second air inlet has an edge which is located opposite to the air outlet and is coincident with an edge of the first air inlet opposite to the air outlet.

5. The thermal module as described in claim 4, wherein a distance between the edge of the bottom plate and the edge of the top lid is equal to a difference of diameters between the first air inlet and the second air inlet.

6. The thermal module as described in claim 3, wherein a top surface of the fin assembly is coplanar with a top surface of the top lid of the centrifugal blower, and a bottom surface of the fin assembly is coplanar with a bottom surface of the bottom plate of the centrifugal blower.

7. An electronic assembly comprising:
    an enclosure for an electronic product comprising a top cover and a bottom cover; and
    a thermal module arranged between the top cover and the bottom cover of the enclosure, comprising:
    a centrifugal blower and a fin assembly arranged in an air outlet of the centrifugal blower, the centrifugal blower comprising:
    a top lid defining a first air inlet therein, a bottom plate defining a second air inlet therein, a sidewall disposed between the top lid and the bottom plate, wherein the air outlet of the centrifugal blower is located in front of the sidewall, and an impeller is disposed in an inner space formed between the top lid, the bottom plate and the sidewall, wherein a first distance formed between a bottom surface of the top cover of the enclosure and a top surface of the top lid of the centrifugal blower is greater than a second distance formed between a top surface of the bottom cover of the enclosure and a bottom surface of the bottom plate of the centrifugal blower, and a first edge of the bottom plate defining the second air inlet and located adjacent to the air outlet offsets a distance from a first edge of the top lid defining the first air inlet and located adjacent to the air outlet inwardly toward a center of the second air inlet; and
    wherein a center of the first air inlet offsets from the center of the second air inlet, the second air inlet being disposed within the first air inlet as viewed from a top of the centrifugal blower.

8. The electronic assembly as described in claim 7, wherein a diameter of the first air inlet is greater than that of the second air inlet.

9. The electronic assembly as described in claim 7, wherein the electronic product is a laptop computer.

* * * * *